United States Patent
Ding et al.

(10) Patent No.: US 8,232,851 B2
(45) Date of Patent: Jul. 31, 2012

(54) ON-CHIP MILLIMETER WAVE LANGE COUPLER

(75) Inventors: Hanyi Ding, Colchester, VT (US); Kwan Him Lam, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 12/404,535

(22) Filed: Mar. 16, 2009

(65) Prior Publication Data

US 2010/0231322 A1    Sep. 16, 2010

(51) Int. Cl.
*H01P 5/18* (2006.01)
(52) U.S. Cl. .................................... 333/116; 333/117
(58) Field of Classification Search ............... 333/116, 333/117
See application file for complete search history.

(56) References Cited

U.S. PATENT DOCUMENTS

| | | | |
|---|---|---|---|
| 3,516,024 A | 6/1970 | Lange | |
| 4,937,541 A * | 6/1990 | Podell et al. | 333/116 |
| 5,563,558 A | 10/1996 | Mohwinkel et al. | |
| 5,834,991 A * | 11/1998 | Mazzochette | 333/116 |
| 6,147,570 A | 11/2000 | Gill | |
| 6,778,037 B1 | 8/2004 | Salmela et al. | |
| 6,794,954 B2 | 9/2004 | Gurvich et al. | |
| 6,952,147 B2 | 10/2005 | Gurvich et al. | |
| 7,042,306 B2 | 5/2006 | Roberson et al. | |
| 7,119,633 B2 | 10/2006 | Stoneham | |
| 2005/0162236 A1 * | 7/2005 | Casper et al. | 333/116 |
| 2006/0009173 A1 | 1/2006 | Gill et al. | |
| 2006/0028295 A1 | 2/2006 | Piernas | |

FOREIGN PATENT DOCUMENTS

WO    0117058 A1    3/2001

OTHER PUBLICATIONS

International Application No. PCT/US2010/025298, filed Feb. 25, 2010, Notification of Transmittal of the International Search Report and the Written Opinion of the International Searching Authority or the Declaration dated Aug. 27, 2010.
Sachse et al., "Theoretical and Experimental Investigations of a Bilevel "Lange" Coupler", Proceedings of the 12th International Conference on Microwaves and Radar, Krakow, Poland, May 22, 1988.

* cited by examiner

*Primary Examiner* — Joseph Chang
(74) *Attorney, Agent, or Firm* — Hoffman Warnick LLC; Anthony J. Canale

(57) ABSTRACT

A Lange coupler having a first plurality of lines on a first level and a second plurality of lines on a second level. At least one line on the first level is cross-coupled to a respective line on the second level via electromagnetic waves traveling through the first and second plurality of lines. The first and second plurality of lines may be made of metal, and the first level may be higher than the second level. A substrate may be provided into which the first and second plurality of lines are etched so as to define an on-chip Lange coupler.

24 Claims, 5 Drawing Sheets

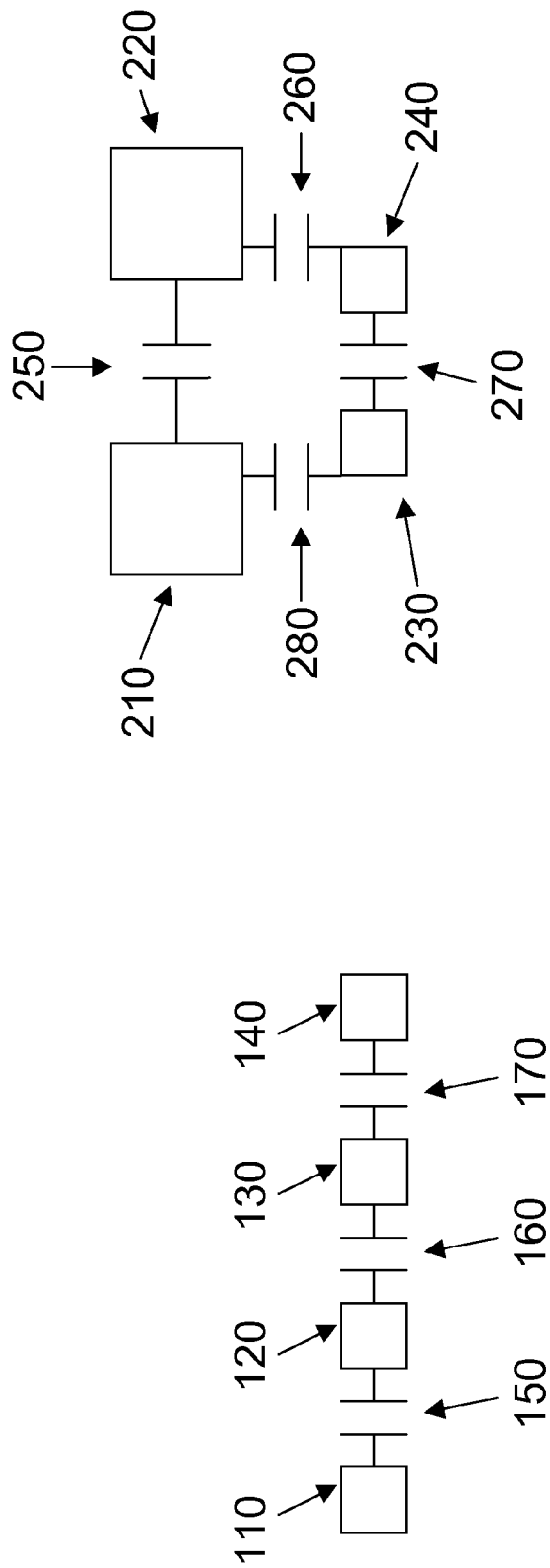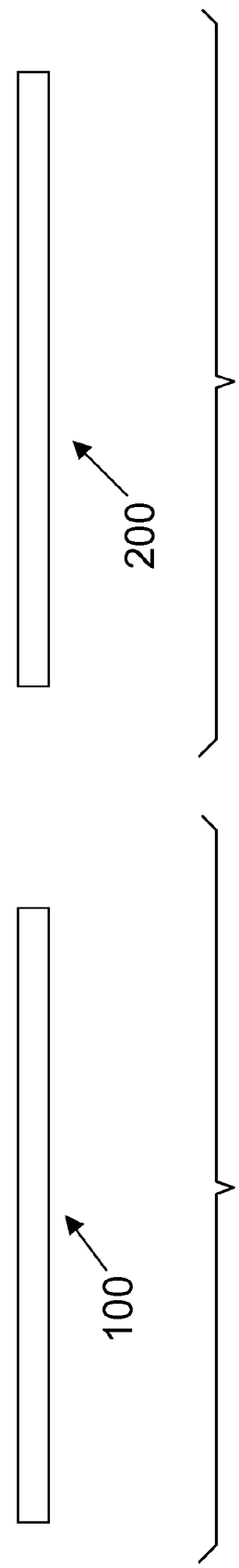
FIG. 1 RELATED ART
FIG. 2

ON-CHIP MILLIMETER WAVE LANGE COUPLER

BACKGROUND

1. Technical Field

The disclosure relates generally to Lange couplers, and more particularly, to an on-chip millimeter wave Lange coupler.

2. Background Art

A 3 dB coupler having a 90° phase difference between the outputs of the 3 dB coupler is a very useful device in microwave and millimeter wave circuit design applications, such as high-frequency in-phase/quadrature (IQ) modulation and balanced amplifier structures. Such a 3 dB coupler can be realized, for example, as a branchline coupler or as a conventional Lange coupler. Normally, branchline couplers have a larger size and less frequency bandwidth than conventional Lange couplers, but the DC signals are shorted among all ports or DC paths exist among all ports.

For on-chip implementations, branchline couplers exhibit a better amplitude balance than conventional Lange couplers but they are much larger in size and, therefore, much more costly. Conventional on-chip Lange couplers utilize higher level metal layers for the signal traces so as to take advantage of the lower resistance loss, but the relatively larger minimum width and spacing of the design rule for those metal layers causes insufficient coupling among the lines and bad amplitude unbalance.

BRIEF SUMMARY

A first aspect of the disclosure provides a Lange coupler having a first plurality of lines on a first level, and a second plurality of lines on a second level. At least one line on the first level is cross-coupled to a respective line on the second level.

A second aspect of the disclosure provides an in-phase/quadrature demodulator including a Lange coupler that splits a Local Oscillator (LO) signal into an in-phase component and a quadrature component. A low noise amplifier (LNA) receives a modulated carrier and outputs an amplified signal; a first mixer receives the amplified signal from the LNA and the in-phase component of the LO signal from the Lange coupler; and a second mixer receives the amplified signal from the LNA and the quadrature component of the LO signal from the Lange coupler. The first and second mixers output I and Q signals demodulated from the modulated carrier received by the LNA.

The Lange coupler of the in-phase/quadrature demodulator has a first plurality of lines on a first level and a second plurality of lines on a second level. At least one line on the first level is cross-coupled to a respective line on the second level.

A third aspect of the disclosure provides a balanced amplifier including a first Lange coupler that divides an input signal fed into the first Lange coupler into two signals and that outputs the two signals with a phase shift to each other. A plurality of amplifiers amplifies the two signals, and a second Lange coupler reverses the phase shift of the two signals and combines the amplified two signals output from the plurality of amplifiers in phase.

Each of the first and second Lange couplers of the balanced amplifier has a first plurality of lines on a first level and a second plurality of lines on a second level. At least one line on the first level is cross-coupled to a respective line on the second level.

A fourth aspect of the disclosure provides an integrated circuit comprising: a Lange coupler including: a first plurality of lines on a first level; and a second plurality of lines on a second level, wherein at least one line on the first level is cross-coupled to a respective line on the second level.

A fifth aspect of the disclosure provides a design structure embodied in a machine readable medium for designing, manufacturing, or testing an integrated circuit, the design structure comprising: a Lange coupler including: a first plurality of lines on a first level; and a second plurality of lines on a second level, wherein at least one line on the first level is cross-coupled to a respective line on the second level.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 1 shows a cross-section view of an on-chip Lange coupler in the related art;

FIG. 2 shows a cross-section view of an on-chip Lange coupler in accordance with an illustrative embodiment of the present invention;

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 3:
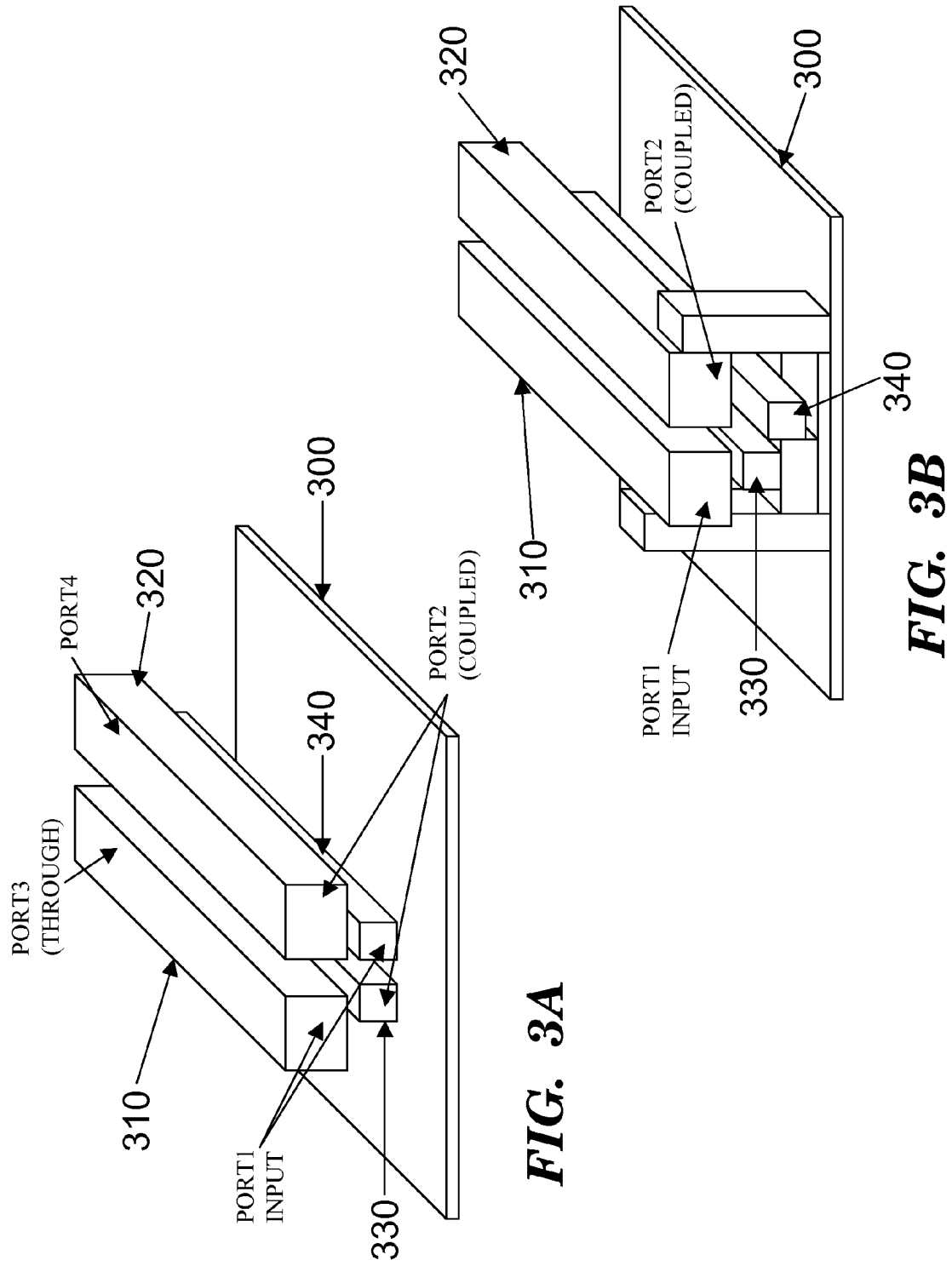
FIG. 3A shows a perspective view of an on-chip Lange coupler in accordance with an illustrative embodiment of the present invention.
FIG. 3B shows a perspective view of an on-chip Lange coupler with connected lines in accordance with an illustrative embodiment of the present invention.

As indicated above, the disclosure provides an on-chip millimeter wave Lange coupler.

FIG. 1 shows a cross-section view of an on-chip Lange coupler in the related art. A substrate 100 has formed into it four lines or strips 110, 120, 130, and 140 that may be made of metal. For an on-chip implementation, all the lines 110, 120, 130, and 140 are on the same metal level. Lines 110 and 130 are connected with each other; and lines 120 and 140 are connected with each other. Capacitors 150, 160, and 170 denote where most of the electromagnetic coupling of electromagnetic waves traveling through the lines 110, 120, 130, and 140 occurs. The electromagnetic waves may be millimeter waves, for example. As can be seen in FIG. 1, very little coupling occurs between lines 110 and 140 at the far ends, for example. Once the minimum spacing and width of the lines are reached, there are no further options in this structure to improve the coupling between the lines.

FIG. 2 shows a cross-section view of an on-chip Lange coupler in accordance with an illustrative embodiment of the present invention. A substrate 200 has formed into it four lines 210, 220, 230, and 240. Lines 210 and 240 are connected to each other; and lines 220 and 230 are connected to each other. All the lines 210, 220, 230, and 240 may be made of metal. Lines 210 and 220 are arranged on a higher metal level than lines 230 and 240. For example, the vertical distance between lines 210/220 and 230/240 may be about 4 µm. This distance may be set by the technology used to manufacture the illustrative embodiment of the present invention shown in FIG. 2.

Further, as indicated by the larger size of the squares for lines 210 and 220 as compared to the size of the squares for lines 230 and 240, the metal strips for lines 210 and 220 may be thicker than the metal strips for lines 230 and 240. For example, lines 210 and 220 may have a thickness of about 4 µm, whereas lines 230 and 240 may have a thickness of about 1.25 µm. Thus, lines 210 and 220 may be approximately three times as thick as lines 230 and 240. In other words, the cross-sections of lines 210 and 220, which may be identical to each other, may be larger than the cross-sections of lines 230 and 240, which may also be identical to each other.

The line thickness is set by the technology used to manufacture the illustrative embodiment of the on-chip Lange coupler shown in FIG. 2. In typical BiCMOS and CMOS technologies for high-frequency applications, the upper level metal strips may be thicker than the lower level metal strips. However, it is not required that lines 210 and 220 be thicker than lines 230 and 240 because the width and spacing of the lines can also be adjusted to optimize the performance of the on-chip Lange coupler.

Capacitors 250, 260, 270, and 280 denote where most of the electromagnetic coupling between lines 210 and 220, 220 and 240, 240 and 230, and 230 and 210, respectively, occurs. By arranging the lines 210, 220, 230 and 240 in a cross-coupling structure as shown in FIG. 2, electromagnetic coupling occurs both in the vertical dimension and in the horizontal dimension. The vertical coupling and the cross-coupling may contribute to additional coupling compared to the horizontal coupling, which is the only type of coupling that takes place in the on-chip Lange coupler of the related art. This leads to improved coupling between all the lines 210, 220, 230, and 240. As a result, the cross-coupling structure in accordance with the illustrative embodiment of the present invention shown in FIG. 2 solves at least the problem of insufficient coupling associated with the on-chip Lange coupler of the related art shown in FIG. 1, under the same layout restraints. Thus, much better amplitude balance performance compared to the on-chip Lange coupler of the related art can be achieved. At the same time, similar performance on insertion loss, matching, phase balance, and physical size is maintained.

FIG. 3A shows a perspective view of an on-chip Lange coupler in accordance with an illustrative embodiment of the present invention. A substrate 300 has formed into it a cross-coupling structure including lines 310, 320, 330, and 340, wherein the lines 310 and 320 are arranged on a higher metal level than the lines 330 and 340. For example, the vertical distance between lines 310/320 and 330/340 may be about 4 µm. This distance may be set by the technology used to manufacture the illustrative embodiment of the present invention shown in FIG. 3.

The lines 310 and 320 may be thicker than the lines 330 and 340. For example, lines 310 and 320 may have a thickness of about 4 µm, whereas lines 330 and 340 may have a thickness of about 1.25 µm. Thus, lines 310 and 320 may be approximately three times as thick as lines 330 and 340. In other words, the cross-sections of lines 310 and 320, which may be identical to each other, may be larger than the cross-sections of lines 330 and 340, which may also be identical to each other.

The line thickness is set by the technology used to manufacture the illustrative embodiment of the on-chip Lange coupler in accordance with the present invention. In typical BiCMOS and CMOS technologies for high-frequency applications, the upper level metal strips may be thicker than the lower level metal strips. However, it is not required that lines 310 and 320 be thicker than lines 330 and 340 because the width and spacing of the lines can also be adjusted to optimize the performance of the on-chip Lange coupler.

Port 1 at the front ends of lines 310 and 340 may be the input-port of the on-chip Lange coupler; Port 2 at the front ends of lines 320 and 330 may be the coupled-port of the on-chip Lange coupler; and Port 3 at the back ends of lines 310 and 340 may be the through-port of the on-chip Lange coupler. The back ends of lines 320 and 330 may define Port 4 of the on-chip Lange coupler.

FIG. 3B shows a perspective view of an on-chip Lange coupler in accordance with an illustrative embodiment of the present invention, representing how the lines 310 and 340 may be connected to each other at their respective ends, and how the lines 320 and 330 may be connected to each other at their respective ends. The respective ends are connected with each other by appropriately L-shaped strip sections, thereby defining an illustrative cross-coupling structure of an on-chip Lange coupler in accordance with the present invention. The lines 330 and 340 may be offset from the lines 310 and 320 for optimizing the performance of the illustrative on-chip Lange coupler. For example, the lines 330 and 340 may be moved towards the center by about 1.88 µm relative to the lines 310 and 320.

In order to compare performance parameters of the Lange coupler in accordance with the present invention to performance parameters of branchline couplers and Lange couplers of the related art, a 60 GHz branchline coupler, a 60 GHZ Lange coupler of the related art, and a 60 GHZ Lange coupler in accordance with an embodiment of the present invention may be designed in BiCMOS8HP technology and simulated through the 3D software "High Frequency Structure Simulator" (HFSS™) by Ansoft Corporation. BiCMOS technology is a method for manufacturing integrated circuit chips that combines bipolar transistors and CMOS devices on the same chip. The suffix 8HP denotes the particular generation of that technology. The on-chip Lange coupler in accordance with the present invention may be used in any integrated circuit (chip level) technologies, such as GaAs, InP, BICMOS, CMOS, and board level design but may be more useful in BiCMOS and CMOS technologies as there are more constraints on line widths, thickness and height in these technologies. BiCMOS8HP technology may be used because the devices in this technology are fast enough to be operated at millimeter wave frequency, e.g., at 60 GHz.

The simulation results show that the Lange coupler in accordance with embodiments of the present invention has much better amplitude balance and better total insertion loss than the Lange coupler of the related art, with similar return loss, isolation and size. More specifically, the Lange coupler in accordance with embodiments of the present invention may achieve an amplitude balance of about 0.1 dB, compared to the amplitude balance of about 0.6 dB of the Lange coupler in the related art. Also, the physical size of the Lange coupler in accordance with embodiments of the present invention may be about 250 µm×140 µm, which is much smaller than the physical size of a branchline coupler, which may be about 250 µm×450 µm.

Figure 4:
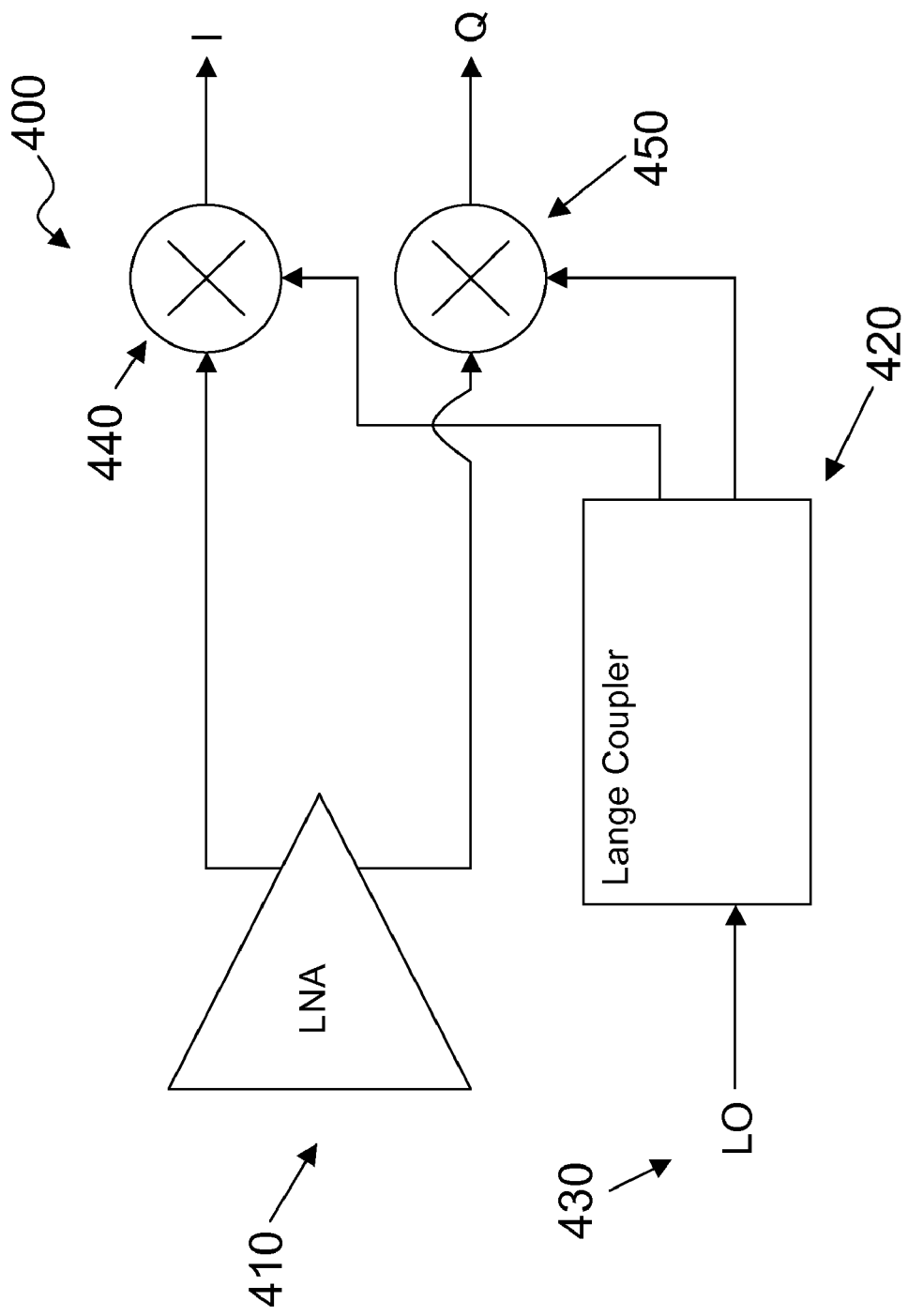
FIG. 4 shows an I/Q demodulator including an on-chip Lange coupler in accordance with an illustrative embodiment of the present invention.

As one of many applications, the on-chip Lange coupler in accordance with embodiments of the present invention may be utilized in an in-phase/quadrature (IQ) demodulation application, as shown in FIG. 4. The illustrative I/Q demodulator 400 shown in FIG. 4 includes a low noise amplifier (LNA) 410 and an on-chip Lange coupler 420 in accordance with the present invention. A Local Oscillator (LO) signal 420 is input in the Lange coupler 420 and split into in-phase (I) and quadrature (Q) components that are separated by 90°. These two signals, together with the amplified output signals of the LNA, drive separate mixers 440 and 450 whose outputs are I and Q signals demodulated from the modulated carrier received by the LNA.

Figure 5:
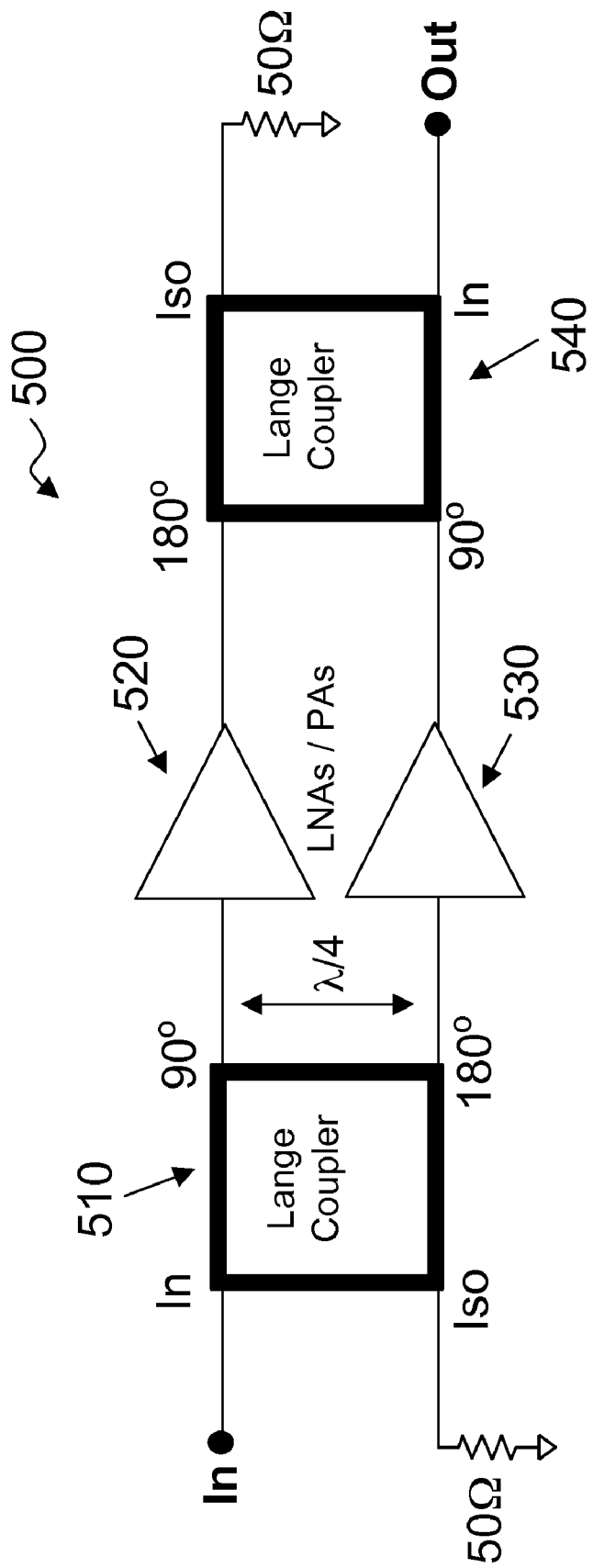
FIG. 5 shows a balanced amplifier including on-chip Lange couplers in accordance with an illustrative embodiment of the present invention.

As another one of a great variety of applications of the on-chip Lange coupler in accordance with embodiments of the present invention, FIG. 5 shows an illustrative balanced amplifier 500 including a Lange coupler 510, two low noise amplifier/power amplifiers (LNA/PA) 520, 530, and another Lange coupler 540. An input signal IN is fed through a 90° power divider in the form of the Lange coupler 510 in accordance with embodiments of the present invention, equally divided, and injected into the inputs of the two single-end LNA/PA amplifiers 520, 530 that are connected in parallel in each branch as shown. The Lange coupler 510 phase-shifts the two signals at the inputs of the amplifiers 520, 530 by 90°. The two amplifiers 520, 530 operate 90° apart in phase and output amplified signals which are then combined by a 90° power combiner in the form of the Lange coupler 540 in accordance with embodiments of the present invention as the output signal Out. The Lange coupler 540 reverses the phase shift of the two signals at the output of the amplifiers 520, 530 so that they combine in phase.

Figure 6:
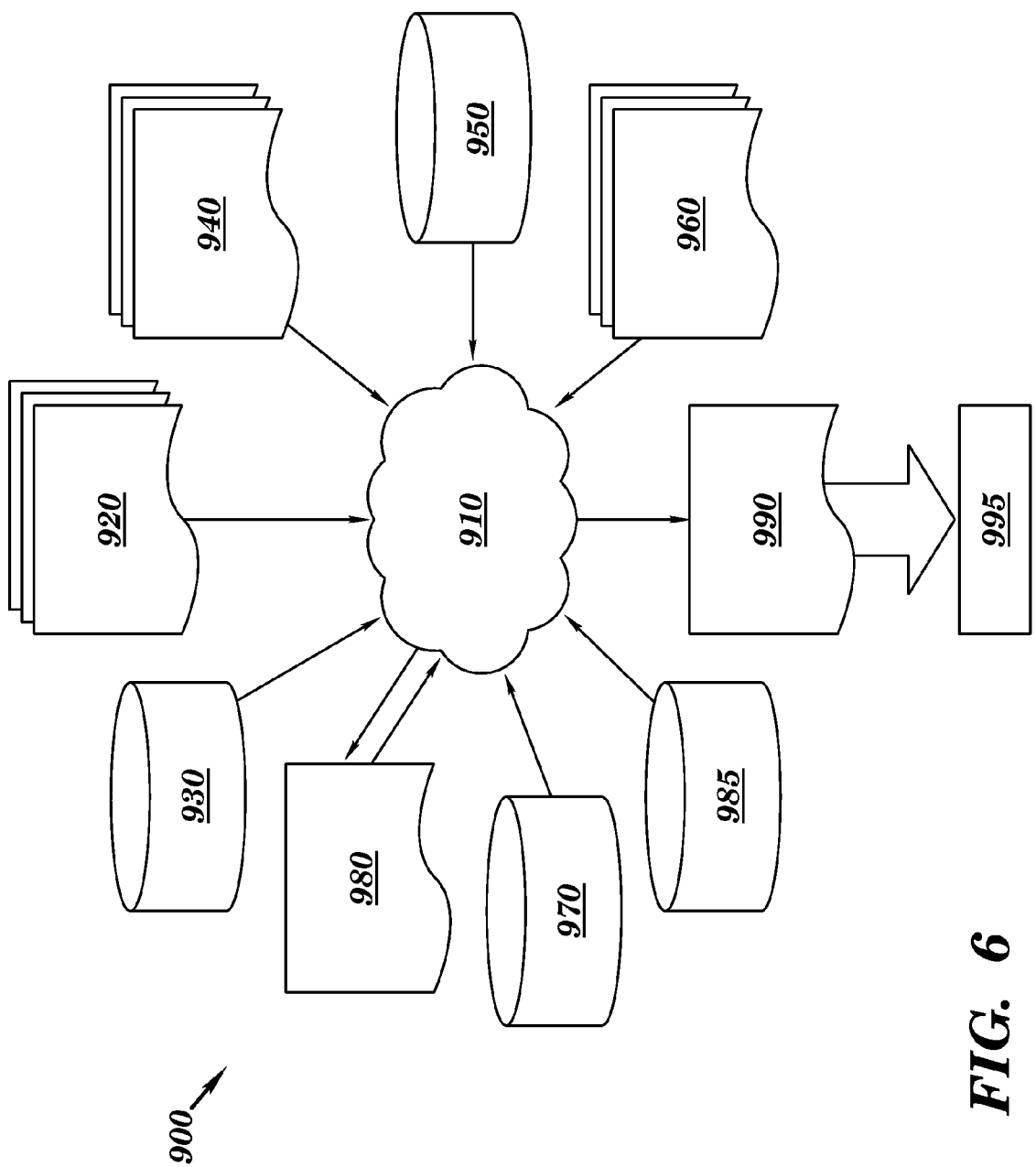
FIG. 6 shows a flow diagram of a design process used in semiconductor design, manufacture, and/or test.

FIG. 6 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 2-5 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 2-5. Design process 910 preferably synthesizes (or translates) an embodiment of the invention as shown in FIGS. 2-5 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 2-5, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2-5. Design structure 990 may then proceed to a stage 995 where, for example, design structure 990: proceeds to tape-out, is released to manufacturing, is released to a mask house, is sent to another design house, is sent back to the customer, etc.

The structures as described above are used in integrated circuit chips. The integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A Lange coupler, comprising:
a first plurality of lines on a first level; and
a second plurality of lines on a second level, each of the second plurality of lines on the second level corresponding with a line from the first plurality of lines on the first level,
wherein at least two lines on the first level are coupled to at least two lines on the second level, wherein each of the at least two lines on the first level is coupled to at least one non-corresponding line on the first level and at least one non-corresponding line on the second level,
wherein the coupling of the at least two lines on the first level to the at least two lines on the second level form at least two sets of shorted lines extending between the first level and the second level, a first set of shorted lines having an end in the first level and an opposite end in the second level, a second set of shorted lines having an end in the first level and an opposite end in the second level, the coupling of the first set of shorted lines to the first level and the second level forming a cross-coupling figuration with the coupling of the second set of shorted lines to the first level and the second level.

2. The Lange coupler of claim 1, wherein the first level is higher than the second level.

3. The Lange coupler of claim 1, wherein the first and second plurality of lines are made of metal.

4. The Lange coupler of claim 1, wherein cross-sections of the lines of the first plurality of lines are substantially identical,
wherein cross-sections of the lines of the second plurality of lines are substantially identical, and
wherein the cross-sections of the lines of the first plurality of lines are larger than the cross-sections of the lines of the second plurality of lines.

5. The Lange coupler of claim 1, further comprising a substrate into which the first and second plurality of lines are etched so as to define an on-chip Lange coupler.

6. The Lange coupler of claim 1, wherein the at least two lines on the first level are coupled to the at least two lines on the second level via electromagnetic waves traveling through the first and second plurality of lines.

7. The Lange coupler of claim 6, wherein the electromagnetic waves are millimeter waves.

8. The Lange coupler of claim 1, further comprising at least two strips to respectively connect the at least two lines on the first level to the at least two lines on the second level in a cross-coupled configuration.

9. The Lange coupler of claim 1, wherein the at least two lines on the first level and the at least two lines on the second level are each coupled horizontally.

10. The Lange coupler of claim 1, wherein each of the at least two lines on the first level are coupled vertically to a corresponding line on the second level.

11. The Lange coupler of claim 1, wherein ends of each of the first plurality of lines on the first level are unconnected with each other, and ends of each of the second plurality of lines on the second level are unconnected with each other.

12. An integrated circuit comprising:
a Lange coupler including:
a first plurality of lines on a first level; and
a second plurality of lines on a second level, each of the second plurality of lines on the second level corresponding with a line from the first plurality of lines on the first level,
wherein at least two lines on the first level are coupled to at least two lines on the second level, wherein each of the at least two lines on the first level is coupled to at least one non-corresponding line on the first level and at least one non-corresponding line on the second level,
wherein the coupling of the at least two lines on the first level to the at least two lines on the second level form at least two sets of shorted lines extending between the first level and the second level, at first set of shorted lines having an end in the first level and an opposite end in the second level, a second set of shorted lines having an end in the first level and an opposite end in the second level, the coupling of the first set of shorted lines to the first level and the second level forming a cross-coupling figuration with the coupling of the second set of shorted lines to the first level and the second level.

13. The integrated circuit of claim 12, wherein the Lange coupler further comprises at least two strips to respectively connect the at least two lines on the first level to the at least two lines on the second level in a cross-coupled configuration.

14. The integrated circuit of claim 12, wherein the at least two lines on the first level and the at least two lines on the second level are each coupled horizontally.

15. The integrated circuit of claim 12, wherein each of the at least two lines on the first level are coupled vertically to a corresponding line on the second level.

16. The integrated circuit of claim 12, wherein ends of each of the first plurality of lines on the first level are unconnected with each other, and ends of each of the second plurality of lines on the second level are unconnected with each other.

17. A design structure embodied in a non-transitory machine readable medium for designing, manufacturing, or testing an integrated circuit, the design structure embodied in the non-transitory machine readable medium being executable on a computer system to provide elements of the integrated circuit that comprise:
a Lange coupler including:
a first plurality of lines on a first level; and
a second plurality of lines on a second level, each of the second plurality of lines on the second level corresponding with a line from the first plurality of lines on the first level,
wherein at least two lines on the first level are coupled to at least two lines on the second level, wherein each of the at least two lines on the first level is coupled to at least one non-corresponding line on the first level and at least one non-corresponding line on the second level,
wherein the coupling of the at least two lines on the first level to the at least two lines on the second level form at least two sets of shorted lines extending between the first level and the second level, a first set of shorted lines having an end in the first level and an opposite end in the second level, a second set of shorted lines having an end in the first level and an opposite end in the second level, the coupling of the first set of shorted lines to the first level and the second level forming a cross-coupling figuration with the coupling of the second set of shorted lines to the first level and the second level.

18. The design structure of claim 17, wherein the design structure comprises a netlist.

19. The design structure of claim 17, wherein the design structure resides on storage medium as a data format used for the exchange of layout data of integrated circuits.

20. The design structure of claim 17, wherein the design structure includes at least one of test data, characterization data, verification data, or design specifications.

21. The design structure of claim 17, wherein the Lange coupler further comprises at least two strips to respectively connect the at least two lines on the first level to the at least two lines on the second level in a cross-coupled configuration.

22. The design structure of claim 17, wherein the at least two lines on the first level and the at least two lines on the second level are each coupled horizontally.

23. The design structure of claim 17, wherein each of the at least two lines on the first level are coupled vertically to a corresponding line on the second level.

24. The design structure of claim 17, wherein ends of each of the first plurality of lines on the first level are unconnected with each other, and ends of each of the second plurality of lines on the second level are unconnected with each other.

* * * * *